(12) United States Patent
Maeno

(10) Patent No.: US 8,274,319 B2
(45) Date of Patent: Sep. 25, 2012

(54) SEMICONDUCTOR DEVICE

(75) Inventor: Muneaki Maeno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 12/723,796

(22) Filed: Mar. 15, 2010

(65) Prior Publication Data

US 2011/0032016 A1 Feb. 10, 2011

(30) Foreign Application Priority Data

Aug. 6, 2009 (JP) .................................. 2009-183673

(51) Int. Cl.
*H03K 3/289* (2006.01)
(52) U.S. Cl. ........................................ 327/203
(58) Field of Classification Search .................. None
See application file for complete search history.

(56) References Cited

U.S. PATENT DOCUMENTS

| | | | | |
|---|---|---|---|---|
| 5,926,519 | A * | 7/1999 | Yoshikawa et al. | 377/54 |
| 6,680,622 | B2 * | 1/2004 | Zounes | 326/16 |
| 6,975,152 | B1 * | 12/2005 | Lapidus | 327/202 |
| 7,053,424 | B2 | 5/2006 | Ono | |

FOREIGN PATENT DOCUMENTS

| | | |
|---|---|---|
| JP | 11-055081 | 2/1999 |
| JP | 2001-332626 | 11/2001 |

* cited by examiner

*Primary Examiner* — Lincoln Donovan
*Assistant Examiner* — Sibin Chen
(74) *Attorney, Agent, or Firm* — Turocy & Watson, LLP

(57) ABSTRACT

A semiconductor device includes a flip-flop circuit formed in a CMOS semiconductor integrated circuit. The flip-flop circuit includes at least a first clock generating inverter that generates a first clock signal and a second clock generating inverter that generates a second clock signal obtained by inverting the first clock signal, the first clock generating inverter and the second clock generating inverter are arranged so as to sandwich a latch unit, the latch unit including a master latch unit and a slave latch unit in the flip-flop circuit, the first clock generating inverter and a first other circuit in the flip-flop circuit are configured to share a source region, the first other circuit being adjacent to the first clock generating inverter, and the second clock generating inverter and a second other circuit in the flip-flop circuit are configured to share a source region, the second other circuit being adjacent to the second clock generating inverter.

20 Claims, 13 Drawing Sheets

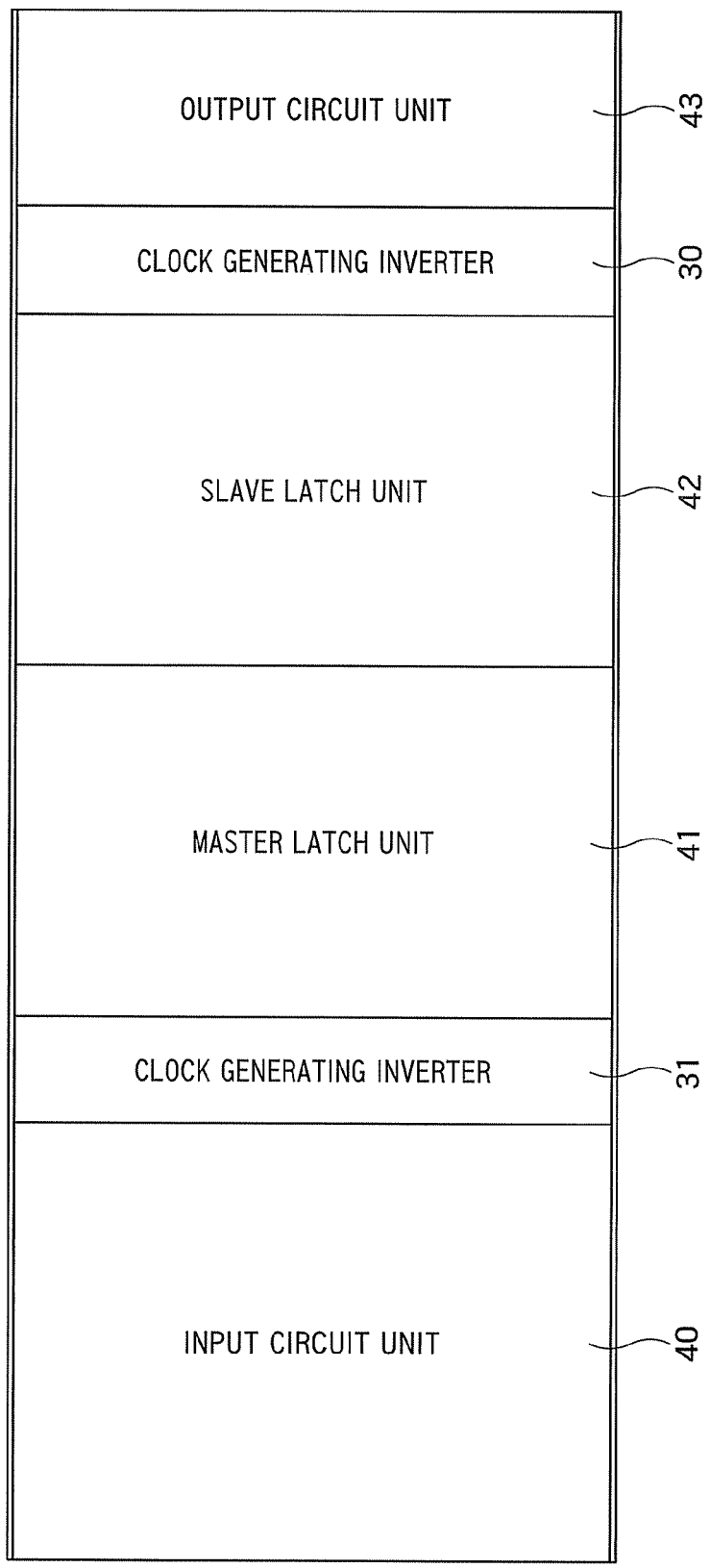

US 8,274,319 B2

SEMICONDUCTOR DEVICE

CROSS REFERENCE TO RELATED APPLICATIONS

This application is based upon and claims the benefit of priority from the prior Japanese Patent Application No. 2009-183673 filed on Aug. 6, 2009 in Japan, the entire contents of which are incorporated herein by reference.

BACKGROUND OF THE INVENTION

1. Field of the Invention

The present invention relates to a semiconductor device.

2. Related Art

Conventionally, the flip-flop circuit composed of a CMOS circuit as a standard cell has included two built-in clock generating inverters which turn on/off gates of both a transmission gate and a clocked inverter. Those clock generating inverters have been arranged together frequently. In this case, diffusion regions of those clock generating inverters have been separated from the other diffusion regions, so that it has been necessary to form a lot of shallow trench isolation (STI) regions, as element isolation regions, in the flip-flop circuit.

For example, in a flip-flop disclosed in FIG. 1 of Japanese Patent Application Laid-Open No. 2001-332626, two inverters (clock generating inverters) that are supplied with a clock signal CK to generate clock signals CK0/XCK0 respectively are arranged together in such a manner that they may share the same source region. The inverters have required an STI region on both sides thereof.

Thus, conventionally, a lot of STI regions have been formed to increase the cell size of the flip-flop circuit. Therefore, there has been a problem in that the large size of the flip-flop circuits, which occupy about 40% of a logic region of an IC chip, increases the chip size.

Further, as disclosed in Japanese Patent Application Laid-Open No. 11-55081, a pulse generation circuit (clock generating inverter) can be arranged outside of a plurality of flip-flops so that the pulse generation circuit may be common to those flip-flops, thereby decreasing the area of the flip-flops. However, long interconnections are required between each of the flip-flops and the pulse generation circuit to give rise to a difference in phase between clock pulses applied to those flip-flops, thus resulting in a problem of malfunctioning thereof.

SUMMARY OF THE INVENTION

In accordance with one embodiment of the present invention, there is provided a semiconductor device including: a flip-flop circuit formed in a CMOS semiconductor integrated circuit, wherein the flip-flop circuit includes at least a first clock generating inverter that generates a first clock signal, and a second clock generating inverter that generates a second clock signal obtained by inverting the first clock signal, the first clock generating inverter and the second clock generating inverter are arranged so as to sandwich a latch unit, the latch unit including a master latch unit and a slave latch unit in the flip-flop circuit, the first clock generating inverter and a first other circuit in the flip-flop circuit are configured to share a source region, the first other circuit being adjacent to the first clock generating inverter, and the second clock generating inverter and a second other circuit in the flip-flop circuit are configured to share a source region, the second other circuit being adjacent to the second clock generating inverter.

BRIEF DESCRIPTION OF THE DRAWINGS

FIG. 2 is a schematic diagram showing an arrangement of each component in the layout of the scan flip-flop according to the first embodiment of the present invention;

DETAILED DESCRIPTION OF THE INVENTION

Before describing embodiments of the present invention, a flip-flop of a comparative example, the present inventor perceive, will be described.

Figure 8:
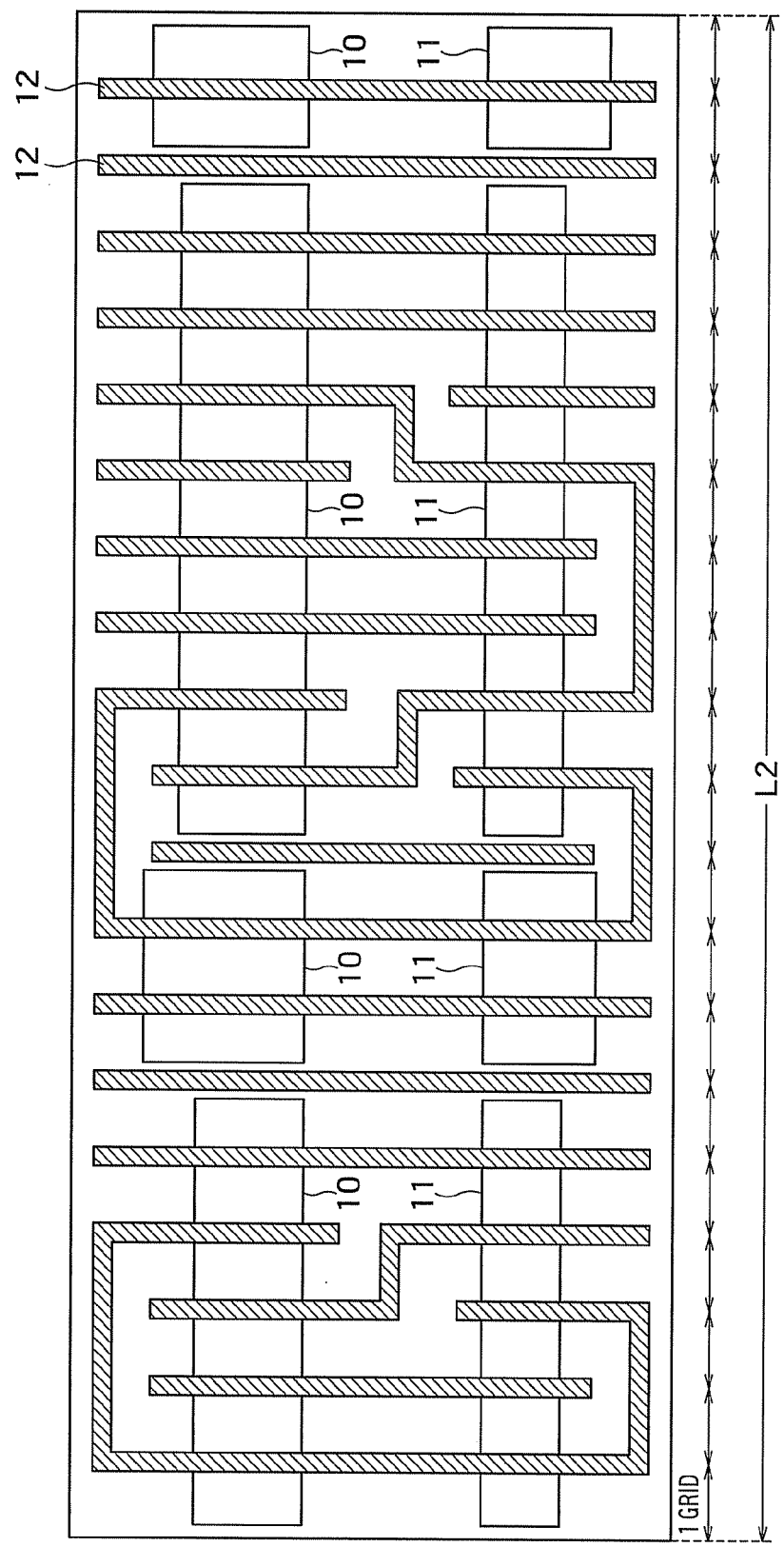
FIG. 8 is a plan view showing a layout of a scan flip-flop of a comparative example.
Figure 9:
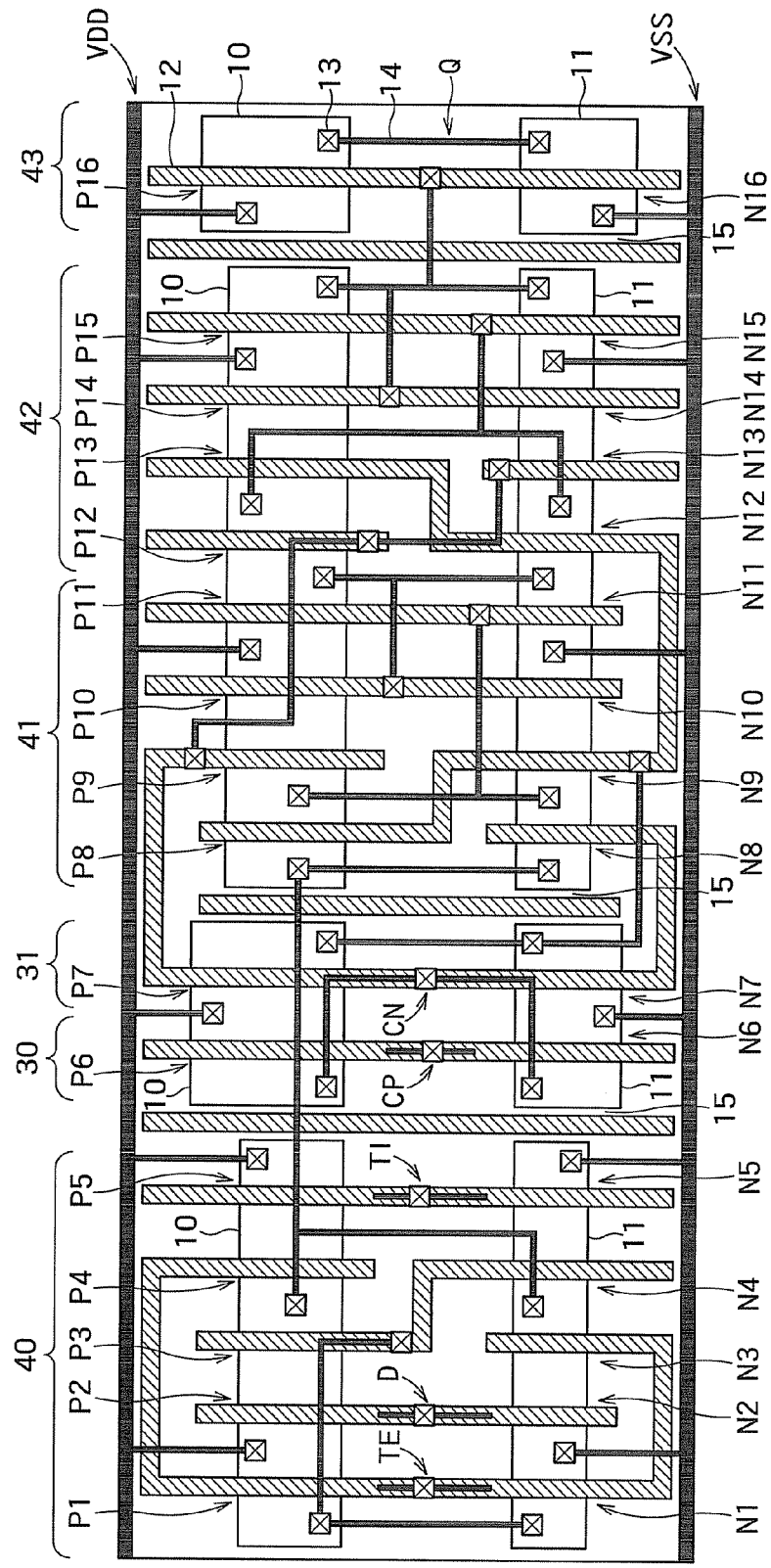
FIG. 9 is another plan view showing the layout of the scan flip-flop of the comparative example.

FIGS. 8 and 9 show the layout of transistors of the scan flip-flop of the comparative example. FIG. 8 shows only diffusion regions 10 and 11 that function as source and drain regions of a CMOS transistor, as well as a gate and a gate interconnection 12. FIG. 9 shows the layout of FIG. 8 plus wiring of a contact 13 and a first metal interconnection 14 (metal interconnection in the first layer) for the purpose of constituting the scan flip-flop.

Figure 10:
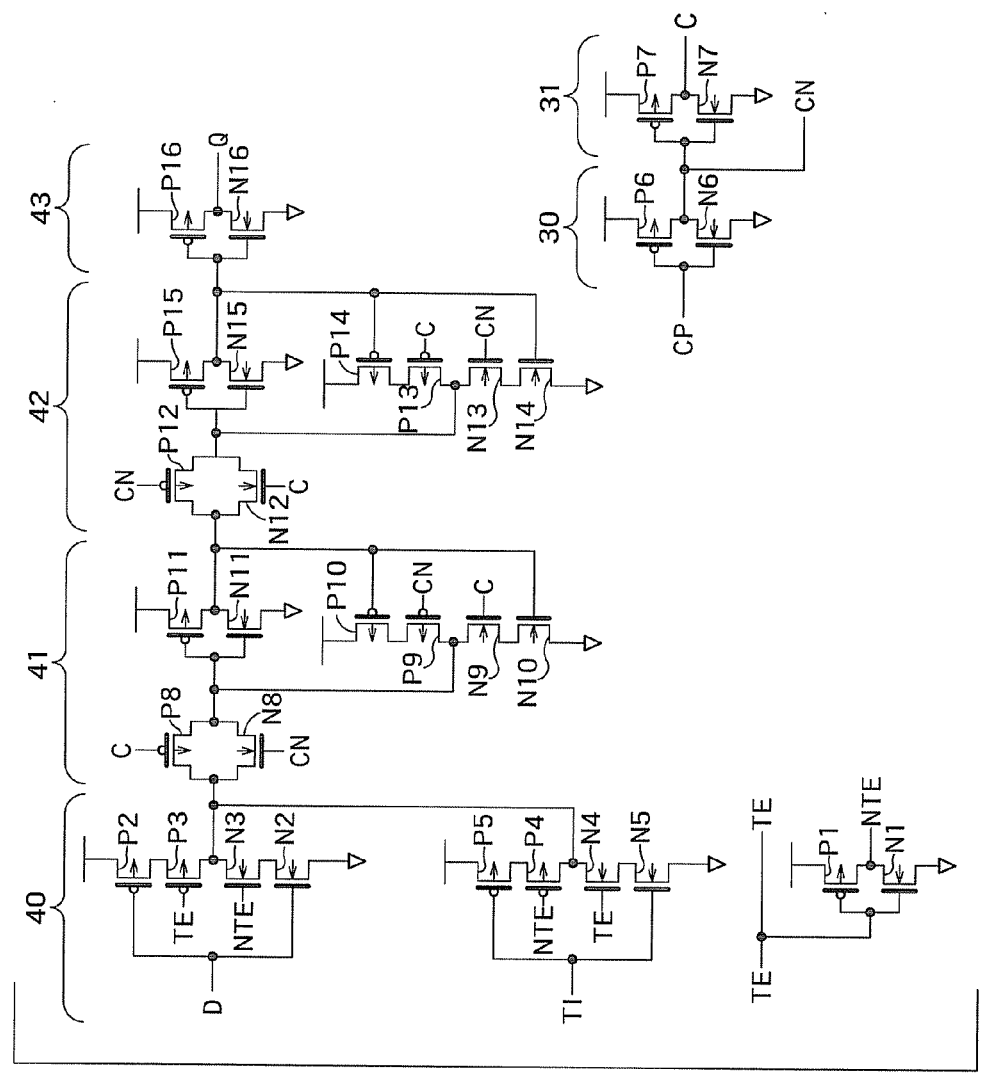
FIG. 10 is a circuit diagram of the scan flip-flop of the comparative example.

FIG. 10 is a circuit diagram (transistor schematic) of the scan flip-flop. Symbols P1 to P16 and symbols N1 to N16 in FIGS. 9 and 10 indicate a PMOS transistor and an NMOS transistor, respectively. In FIGS. 9 and 10, identical reference numerals are given to corresponding transistors.

As shown in FIGS. 9 and 10, the scan flip-flop includes clock generating inverters 30 and 31, an input circuit unit 40, a master latch unit 41, a slave latch unit 42, and an output circuit unit 43.

The clock generating inverter 30 is composed of transistors P6/N6. The clock generating inverter 31 is composed of transistors P7/N7. The input circuit unit 40 includes an inverter composed of transistors P1/N1, a clocked inverter (third clocked inverter) composed of transistors P2/N2 and P3/N3, and a clocked inverter (fourth clocked inverter) composed of transistors P4/N4 and P5/N5. The master latch unit 41 includes a transmission gate (first transmission gate) composed of transistors P8/N8, a clocked inverter (first clocked inverter) composed of transistors P9/N9 and P10/N10, and an inverter (first inverter) composed of transistors P11/N11. The slave latch unit 42 includes a transmission gate (second transmission gate) composed of transistors P12/N12, a clocked inverter (second clocked inverter) composed of transistors P13/N13 and P14/N14, and an inverter (second inverter) composed of transistors P15/N15. The output circuit unit 43 includes an output inverter composed of transistors P16/N16.

The clock generating inverter 30 inverts a clock signal CP supplied thereto to generate a clock signal CN (first clock signal) and outputs the clock signal CN to the master latch unit 41 and the slave latch unit 42. The clock generating inverter 31 inverts the clock signal CN to generate a clock signal C (second clock signal) and outputs the clock signal C to the master latch unit 41 and the slave latch unit 42. The input circuit unit 40, in response to a signal TE (control signal), selects either an input signal D (first input signal) or an input signal TI (second input signal), inverts the selected signal, and supplies it to the master latch unit 41. Based on the clock signals C and CN, the master latch unit 41 and the slave latch unit 42 latch a signal supplied from the input circuit unit 40 and output the latched signal to the output circuit unit 43. The output circuit unit 43 inverts the signal from the slave latch unit 42 and outputs it as an output signal Q to the outside.

As shown in the layouts of FIGS. 8 and 9, the two clock generating inverters 30 and 31 share source regions of the PMOS transistors P6 and P7 as well as source regions of the NMOS transistors N6 and N7. The two clock generating inverters 30 and 31 are disposed on the left side of the master latch unit 41. Those shared source regions are connected to a power supply interconnection VDD (higher-voltage side power supply interconnection) or a power supply interconnection VSS (lower-voltage side power supply interconnection). That is, the diffusion regions 10 of the PMOS transistors P6 and P7 are formed integrally and, similarly, the diffusion regions 11 of the NMOS transistors N6 and N7 are also formed integrally.

The power supply interconnection VDD is disposed at the top of the cell in such a manner as to extend horizontally (in a longer side direction of the cell) and the power supply interconnection VSS is disposed at the bottom of the cell in such a manner as to extend horizontally.

On the left side of the clock generating inverters 30 and 31, the input circuit unit 40 is arranged. On the right side of the master latch unit 41, the slave latch unit 42 is arranged. On the right side of the slave latch unit 42, the output circuit unit 43 is arranged.

In the input circuit unit 40, the diffusion regions 10 of the PMOS transistors P1 to P5 are formed integrally and, similarly, the diffusion regions 11 of the NMOS transistors N1 to N5 are formed integrally as well. In the master latch unit 41 and the slave latch unit 42, the diffusion regions 10 of the PMOS transistors P8 to P15 are formed integrally and, similarly, the diffusion regions 11 of the NMOS transistors N8 to N15 are formed integrally as well.

A horizontal cell size in the layouts of FIGS. 8 and 9 is 20-grid long (length L2), assuming the inter-gate pitch to be one grid.

In FIG. 9, an STI region 15 is formed at three positions as a total, that is, between the transistors P5/N5 and the transistors P6/N6, between the transistors P7/N7 and the transistors P8/N8, and between the transistors P15/N15 and the transistors P16/N16. Further, in FIG. 9, a dummy gate is disposed in the STI region 15 in order to equalize the gate pitches.

Figure 11:
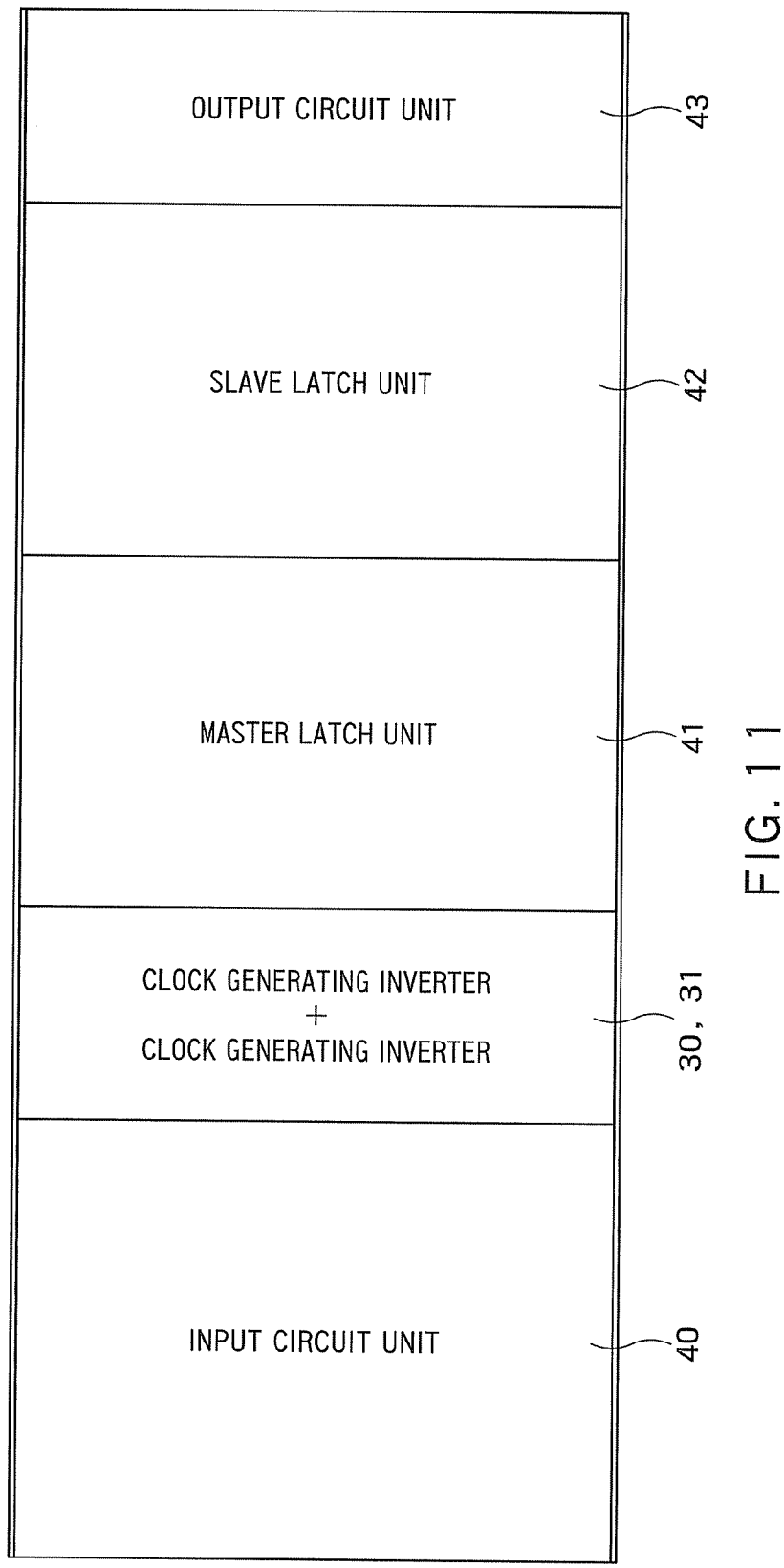
FIG. 11 is a schematic diagram showing an arrangement of each component in the layout of the scan flip-flop of the comparative example.

FIG. 11 is a schematic diagram showing an arrangement of each component in the layout of the scan flip-flop. As described above, the input circuit unit 40, the two clock generating inverters 30 and 31, the master latch unit 41, the slave latch unit 42, and the output circuit unit 43 are arranged in this order.

The embodiments of the present invention will be described below with reference to the drawings. Those embodiments will not limit the present invention.

First Embodiment

The first embodiment of the present invention will be described with reference to FIGS. 1 and 2. In the present embodiment, two clock generating inverters in a scan flip-flop are arranged separately from each other so as to sandwich a master latch and a slave latch, thereby sharing source regions with other circuits in the scan flip-flop.

Figure 1:
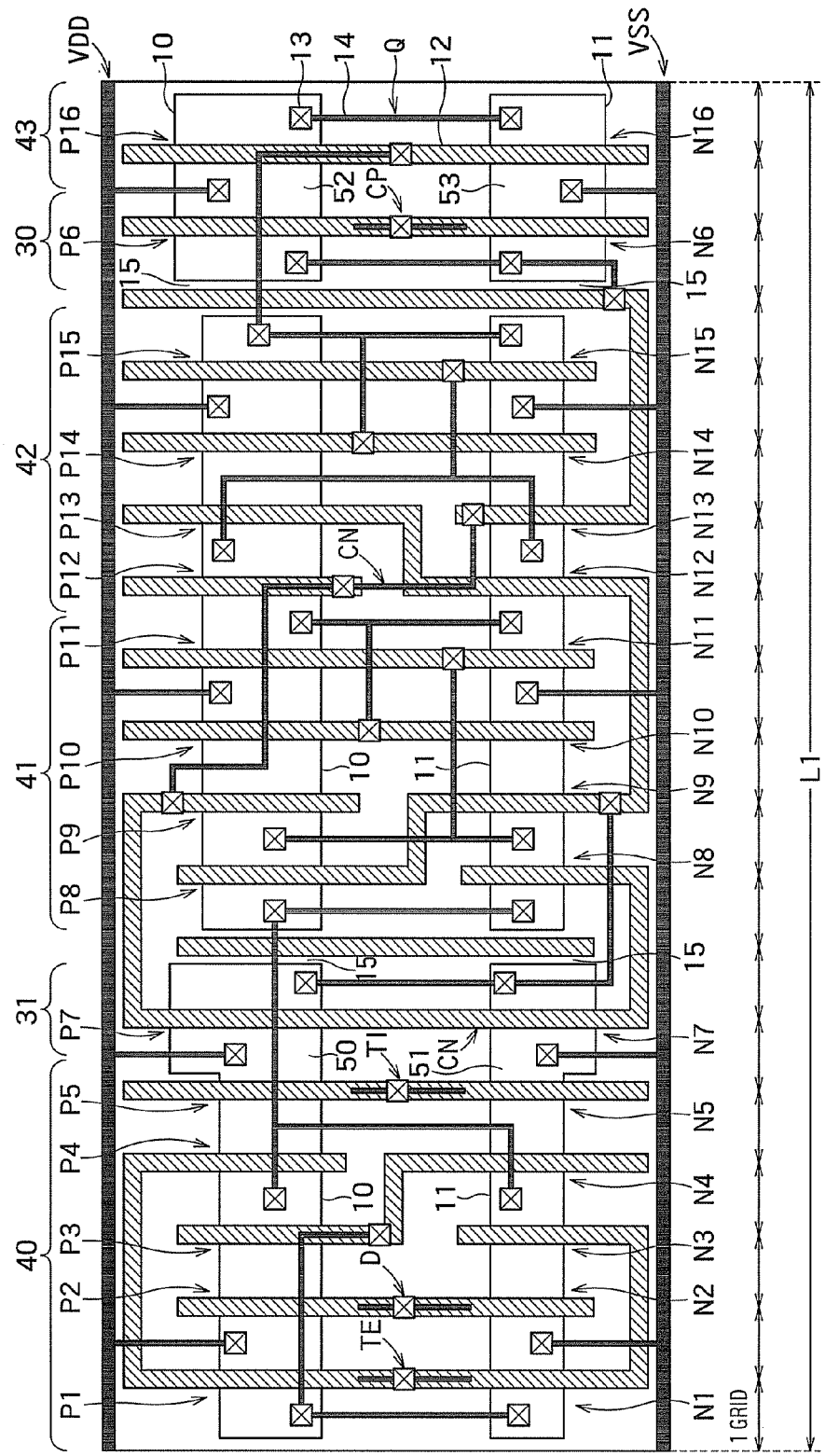
FIG. 1 is a plan view showing a layout of a scan flip-flop according to a first embodiment of the present invention.

FIG. 1 is a plan view showing a layout of the scan flip-flop according to the first embodiment. The layout of this FIG. 1 is equivalent to the circuit configuration of FIG. 10 and configures a scan flip-flop similar to the layout in FIG. 9. In FIG. 1 and FIGS. 9 and 10, identical reference numerals are given to identical components, and regarding FIGS. 9 and 10, explanations thereof will not be repeated.

FIG. 2 is a schematic diagram showing an arrangement of each component in the layout of this scan flip-flop. As shown in FIG. 2, an input circuit unit 40 (second other circuit), a clock generating inverter 31 (second clock generating inverter), a master latch unit 41, a slave latch unit 42, a clock generating inverter 30 (first clock generating inverter), and an output circuit unit 43 (first other circuit) are arranged in this order.

As shown in FIGS. 1 and 2, in the present embodiment, the two inverters of clock generating inverter 30 (transistors P6/N6) and clock generating inverter 31 (transistors P7/N7), which have been arranged in one position so as to share the source regions in the comparative example of FIG. 9, are disposed to two positions separate from each other so as to sandwich the master latch unit 41 and the slave latch unit 42.

Further, the transistors P7/N7 of the clock generating inverter 31 arranged on the left side of the master latch unit 41 and transistors P5/N5 of a clocked inverter at a TI input portion in the input circuit unit 40 which is positioned leftward adjacent to the clock generating inverter 31 share their respective source regions 50 and 51. The source region 50 (first source region) shared by the PMOS transistors is connected to a power supply interconnection VDD and the source region 51 (second source region) shared by the NMOS transistors is connected to a power supply interconnection VSS. The drain regions of the transistors P7/N7 are connected to each other by a metal interconnection, to provide an output of the clock generating inverter 31. Gates of the transistors P7/N7 are connected to each other by a gate interconnection, to provide an input of the clock generating inverter 31.

Further, the transistors P6/N6 of the clock generating inverter 30 disposed on the right side of the slave latch unit 42 and transistors P16/N16 of an output inverter in the output circuit unit 43 which is positioned rightward adjacent to the clock generating inverter 30 share their respective source regions 52 and 53. The source region 52 (third source region) shared by the PMOS transistors is connected to the power supply interconnection VDD, and the source region 53 (fourth source region) shared by the NMOS transistors is connected to the power supply interconnection VSS. The drain regions of the transistors P6/N6 are connected to each other by a metal interconnection, to provide an output of the clock generating inverter 30.

That is, in the present embodiment, each source region which is connected to the power supply interconnection VDD or VSS at the end of the diffusion region 10 or 11, in the layout of the comparative example in FIG. 9, is shared by the clock generating inverter 30 or 31.

In the clock generating inverter 31 and the input circuit unit 40, the diffusion regions 10 of the PMOS transistors P1 to P5 and P7 are formed integrally and, similarly, the diffusion regions 11 of the NMOS transistors N1 to N5 and N7 are also formed integrally. In the clock generating inverter 30 and the output circuit unit 43, the diffusion regions 10 of the PMOS transistors P6 and P16 are formed integrally and, similarly, the diffusion regions 11 of the NMOS transistors N6 and N16 are also formed integrally.

Further, in the present embodiment, the clock generating inverter 30 (transistors P6/N6) and the clock generating inverter 31 (transistors P7/N7) are connected to each other with a metal interconnection 14 and a gate interconnection 12 (clock signal interconnection CN).

By using such a constitution, the number of the STI regions 15 as element isolation regions is decreased from three in the comparative example of FIG. 9 to two, that is, the region between the transistors P7/N7 and the transistors P8/N8, and between the transistors P15/N15 and the transistors P6/N6. This enables reducing the horizontal cell size which has been 20-grid long in the comparative example of FIG. 9 to that of 19 grids (length L1). That is, the horizontal cell size is decreased from the length L2 in the comparative example to the length L1. Since the cell size can thus be reduced by one grid, the layout size of the flip-flops that occupy about 40% of the area of the chip can be decreased, thus reducing the chip size as well.

As described above, according to the present embodiment, the two inverters, namely, clock generating inverters 30 and 31, are arranged so as to sandwich the master latch unit 41 and the slave latch unit 42, so that the clock generating inverter 30 and the output circuit unit 43 may share the same source region and the clock generating inverter 31 and the input circuit unit 40 may share the same source region. With this structure, it is possible to reduce the number of the STI regions 15 as element isolation regions in the cell, thereby decreasing the cell size.

Further, the clock generating inverters 30 and 31 are arranged as described above, to use the existing interconnections as the clock signal interconnections C and CN, so that their lengths can be made equal to those in the case of the scan flip-flop in the comparative example, thereby providing the equivalent performance of the scan flip-flop.

Although the present embodiment has been described with use of a scan flip-flop, the same constitution can be given even with an ordinary flip-flop rather than a scan flip-flop and such a scan flip-flop that a multiplexer circuit is connected as the input circuit unit 40. That is, almost the same effects can be obtained by placing the clock generating inverters 30 and 31 on the right and left sides of the master latch unit 41 and the slave latch unit 42, so that the clock generating inverters 30 and 31 can share the source regions with other circuits, respectively. One example of the ordinary flip-flop will be described later.

Further, although the complicated flip-flop circuits may making wiring between the clock generating inverters 30 and 31 (transistors P6/N6 and transistors P7/N7) difficult, they can be wired by using a metal interconnection and a gate interconnection.

Modification of First Embodiment

Figure 2A:
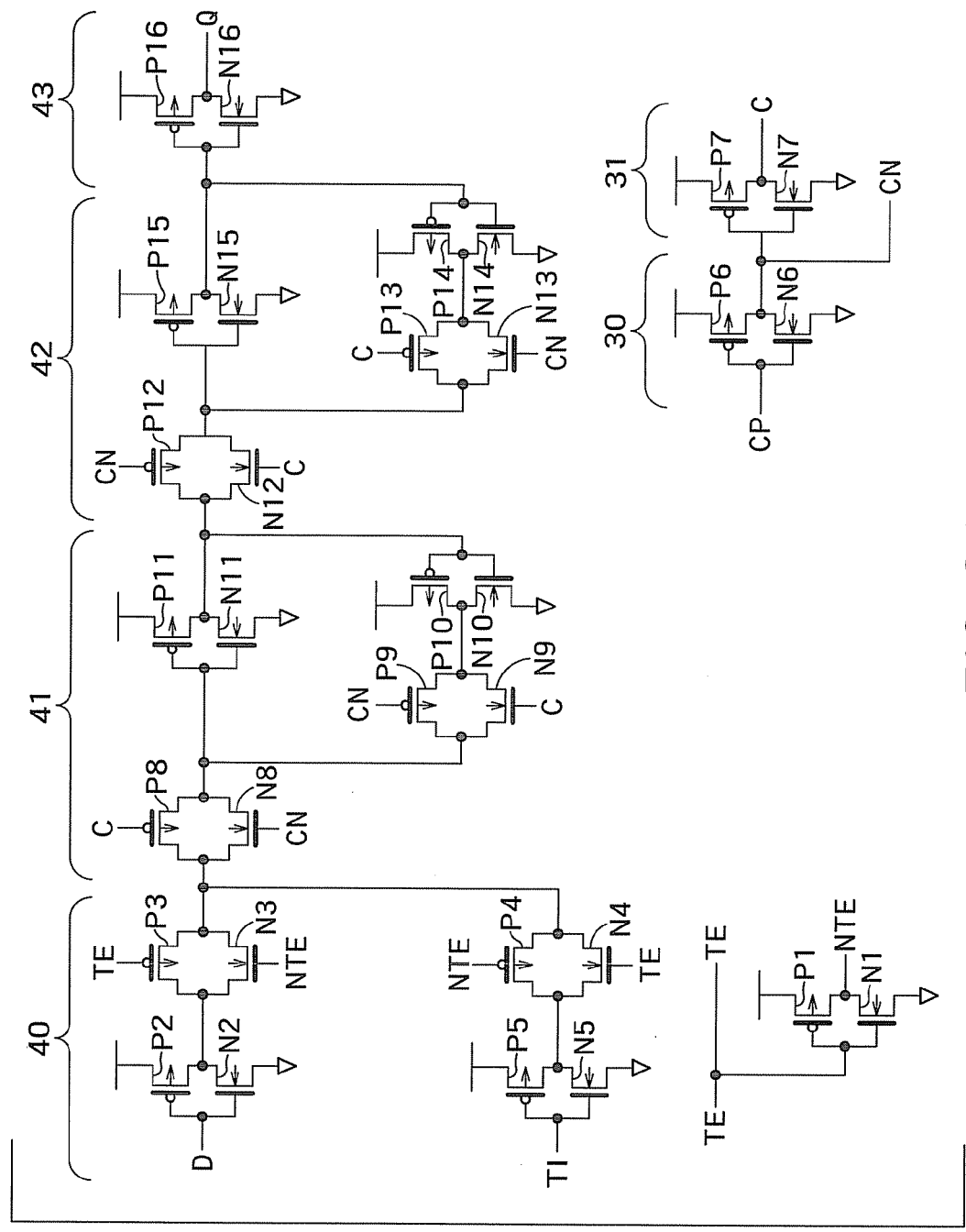
FIG. 2A is a circuit diagram of the scan flip-flop according to a modification of the first embodiment of the present invention.
Figure 2B:
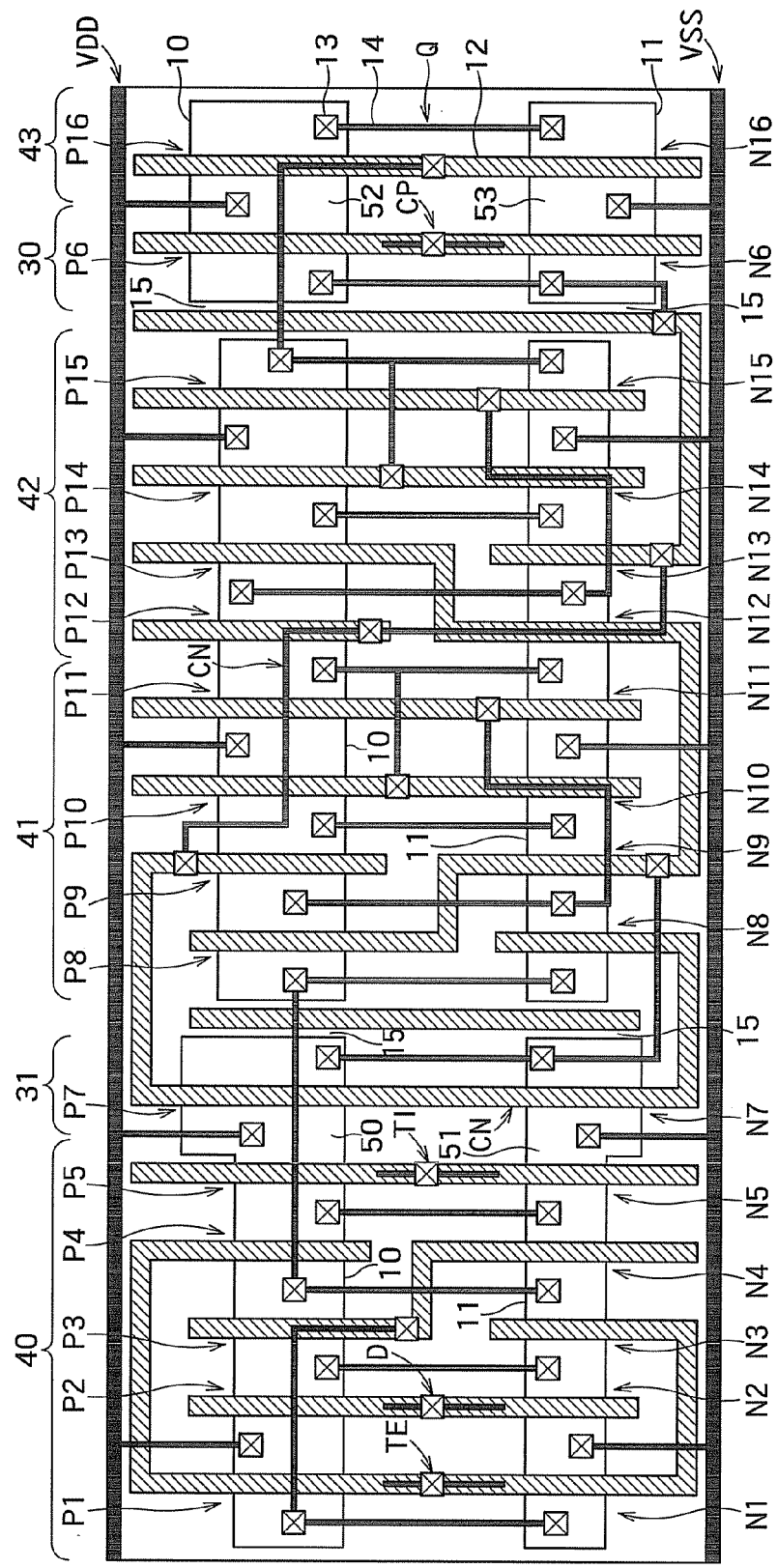
FIG. 2B is a plan view showing a layout of the scan flip-flop according to a modification of the first embodiment of the present invention.

A clocked inverter, which is used in the flip-flop in the first embodiment, functions in the same way even if it is divided into two circuits, that is, an inverter and a transmission gate. An example thereof is shown in FIGS. 2A and 2B. In a flip-flop circuit shown in a circuit diagram of FIG. 2A, each clocked inverter is divided into an inverter and a transmission gate, whose circuit layout is shown in FIG. 2B.

In FIGS. 2A and 2B, a clocked inverter (P9, P10, N9, and N10) in a master latch unit 41 is divided into an inverter (P10 and N10: third inverter) and a transmission gate (P9 and N9: third transmission gate), a clocked inverter (P13, P14, N13, and N14) in a slave latch unit 42 is divided into an inverter (P14 and N14: fourth inverter) and a transmission gate (P13 and N13: fourth transmission gate), a clocked inverter (P2, P3, N2, and N3) in an input circuit unit is divided into an inverter (P2 and N2: fifth inverter) and a transmission gate (P3 and N3: fifth transmission gate), and a further clocked inverter (P4, P5, N4, and N5) is divided into an inverter (P5 and N5: sixth inverter) and a transmission gate (P4 and N4: sixth transmission gate). Even though the clocked inverter is transformed into the inverter and the transmission gate, the horizontal cell size is 19-grid long to enable obtaining the same effects as those of FIG. 1, as shown in FIG. 2B.

Second Embodiment

Next, the second embodiment of the present invention will be described with reference to FIG. 3. The present embodiment is different from the first embodiment in that clock generating inverters are connected to each other only with a gate interconnection.

Figure 3:
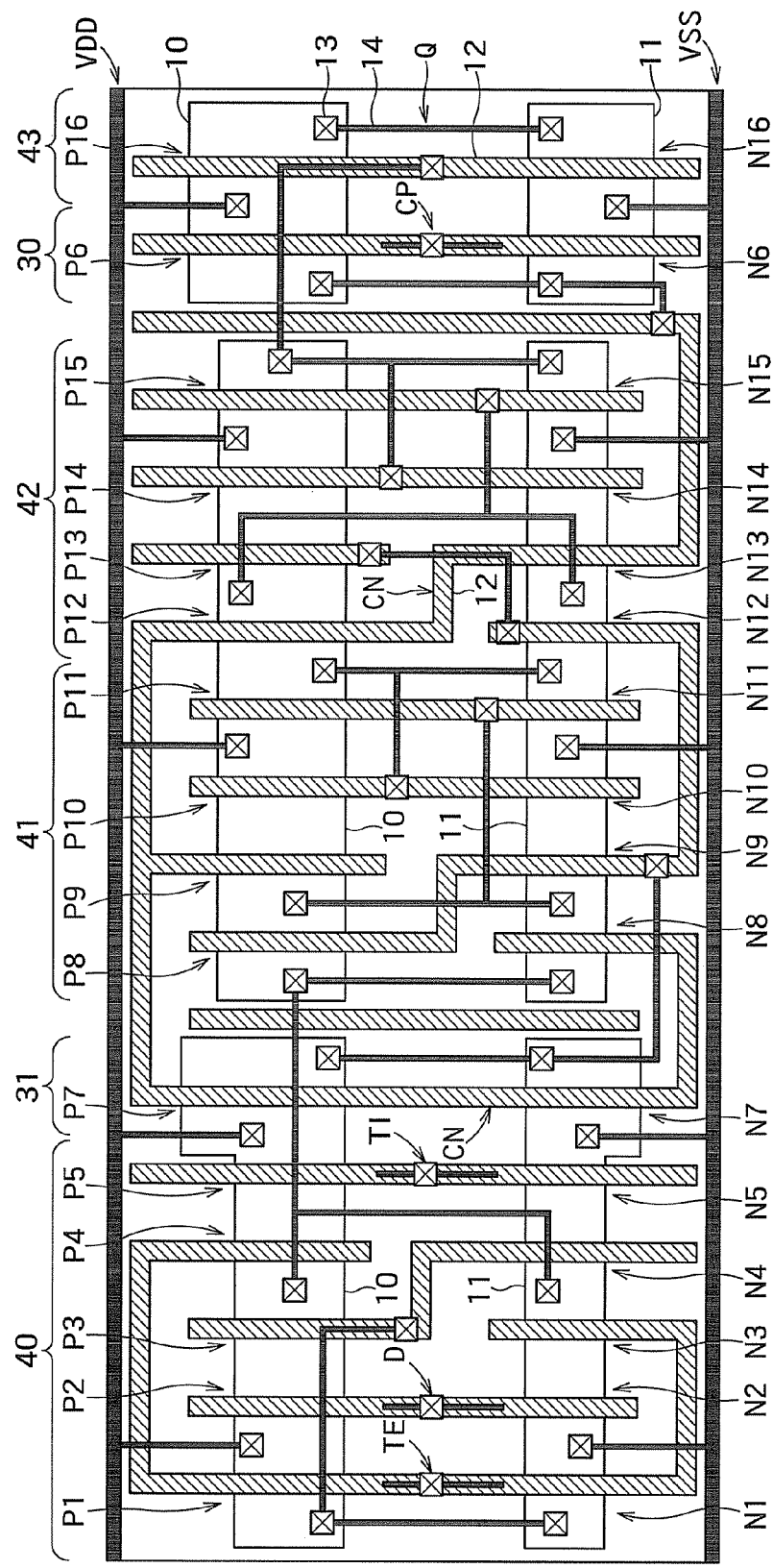
FIG. 3 is a plan view showing a layout of a scan flip-flop according to a second embodiment of the present invention.

FIG. 3 is a plan view showing the layout of a scan flip-flop according to the second embodiment. The scan flip-flop in FIG. 3 has the same functions as those of the scan flip-flop in FIG. 1.

In the present embodiment, as shown in FIG. 3, clock generating inverters 30 and 31 are connected to each other only with a gate interconnection 12 (clock signal interconnection CN). That is, an output of the clock generating inverter 30 and an input of the clock generating inverter 31 are connected to each other only with the gate interconnection 12. Even though they are thus connected to each other only with the gate interconnection 12, it is possible to obtain the same functions as those by the scan flip-flop in FIG. 1. The other components of the circuit are the same as those in FIG. 1, so that identical reference numerals are given to the identical components, and description thereof will not be repeated here.

According to the present embodiment, since the clock generating inverters 30 and 31 are connected to each other only with the gate interconnection 12, upper layer metal interconnections in the cell such as a second metal interconnection (metal interconnection in the second layer) will not be used. Therefore, it is possible to improve the use rate of the upper layer metal interconnections in design of a chip, thereby reducing the chip size.

Further, since the area of the first metal interconnections in the cell can be decreased, the first metal interconnections can be placed with a sufficient distance margin therebetween, thus decreasing a probability of short-circuiting of themselves due to process variations. Therefore, the yield of the chip can be improved.

Further, similarly to the case of the first embodiment, the cell can be formed in a horizontal cell size of 19 grids, which is smaller than that in the scan flip-flop of the comparative example shown in FIG. 9 by one grid. It is thus possible to decrease the size of the flip-flops which occupy about 40% of the area of the chip, thereby reducing the chip size.

Third Embodiment

Next, the third embodiment of the present invention will be described with reference to FIG. 4. The present embodiment is different from the first embodiment in that clock generating inverters are connected to each other only with metal interconnections including a second metal interconnection also.

Figure 4:
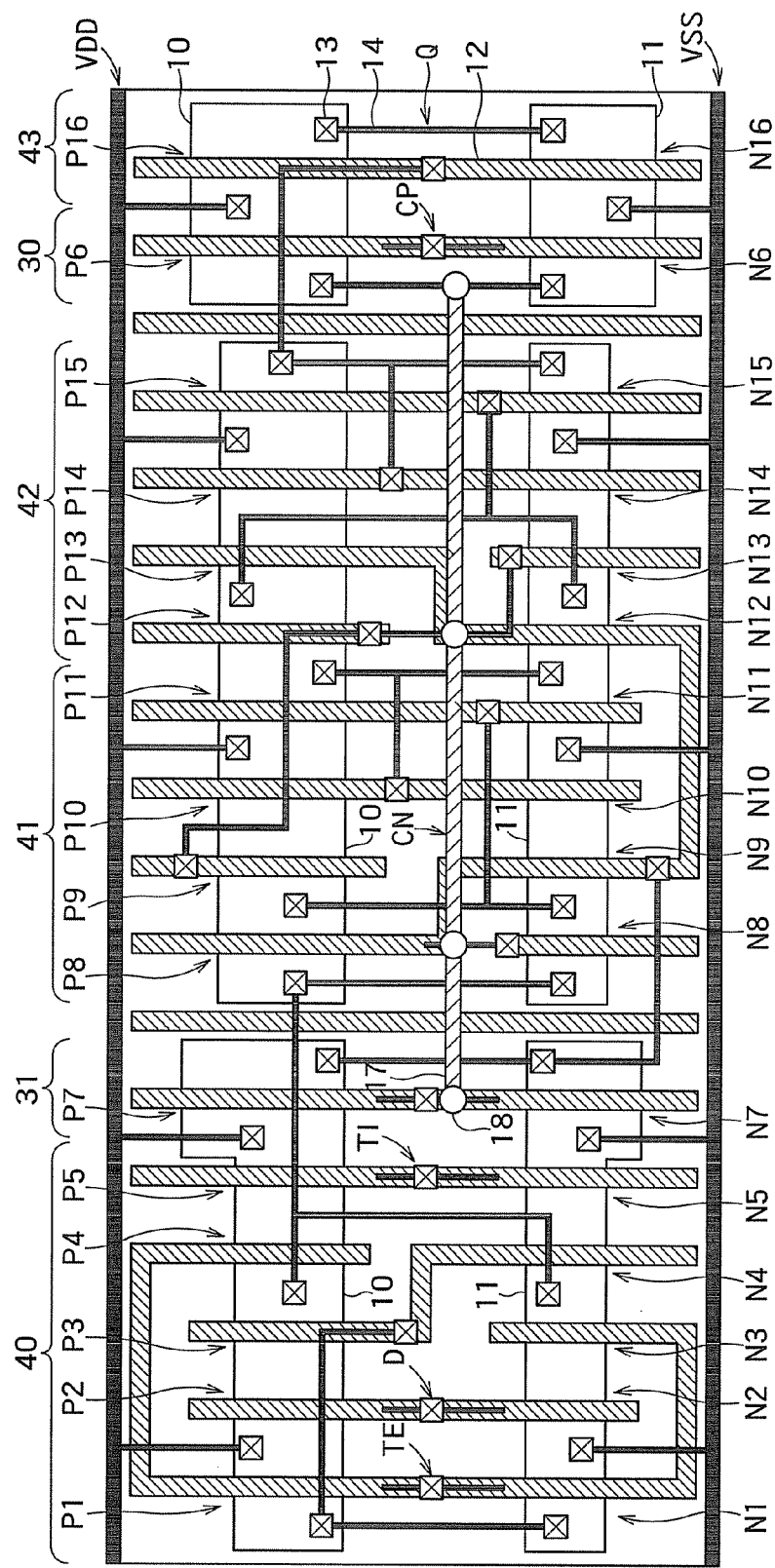
FIG. 4 is a plan view showing a layout of a scan flip-flop according to a third embodiment of the present invention.

FIG. 4 is a plan view showing the layout of a scan flip-flop according to the third embodiment. The scan flip-flop in FIG. 4 has the same functions as those of the scan flip-flop in FIG. 1

In the present embodiment, as shown in FIG. 4, clock generating inverters 30 and 31 are connected to each other only with metal interconnections including a second metal interconnection 17 and a via contact 18 also. Even though they are connected to each other only with the metal interconnections, the same functions as those by the scan flip-flop of FIG. 1 can be obtained. The other components of the circuit are the same as those in FIG. 1, so that identical reference numerals are given to identical components, and descriptions of the identical components will not be repeated here.

According to the present embodiment, since the clock generating inverters are connected to each other only with the metal interconnections, it is possible to equalize shapes of the gate interconnections as shown in FIG. 4 more than the cases of the first embodiment of FIG. 1 and the second embodiment of FIG. 3. Therefore, it is possible to inhibit variations in performance of the transistors owing to process variations.

Further, similarly to the cases of the first and second embodiments, the cell can be formed in a horizontal cell size of 19 grids, which is smaller than that in the scan flip-flop of the comparative example in FIG. 9 by one grid. It is thus possible to decrease the size of the flip-flops which occupy about 40% of the area of the chip, thereby reducing the chip size.

It is to be noted that the clock generating inverter 30 may be placed on the left side of the master latch unit 41, and the clock generating inverter 31 may be placed on the right side of the slave latch unit 42. Even with such an arrangement, almost the same effects as described above can be obtained, since the clock generating inverters 30 and 31 can be connected to each other with the second metal interconnection.

Fourth Embodiment

Next, the fourth embodiment of the present invention will be described with reference to FIGS. 5 to 7. The present embodiment relates to a flip-flop not of the scan type.

Figure 5:
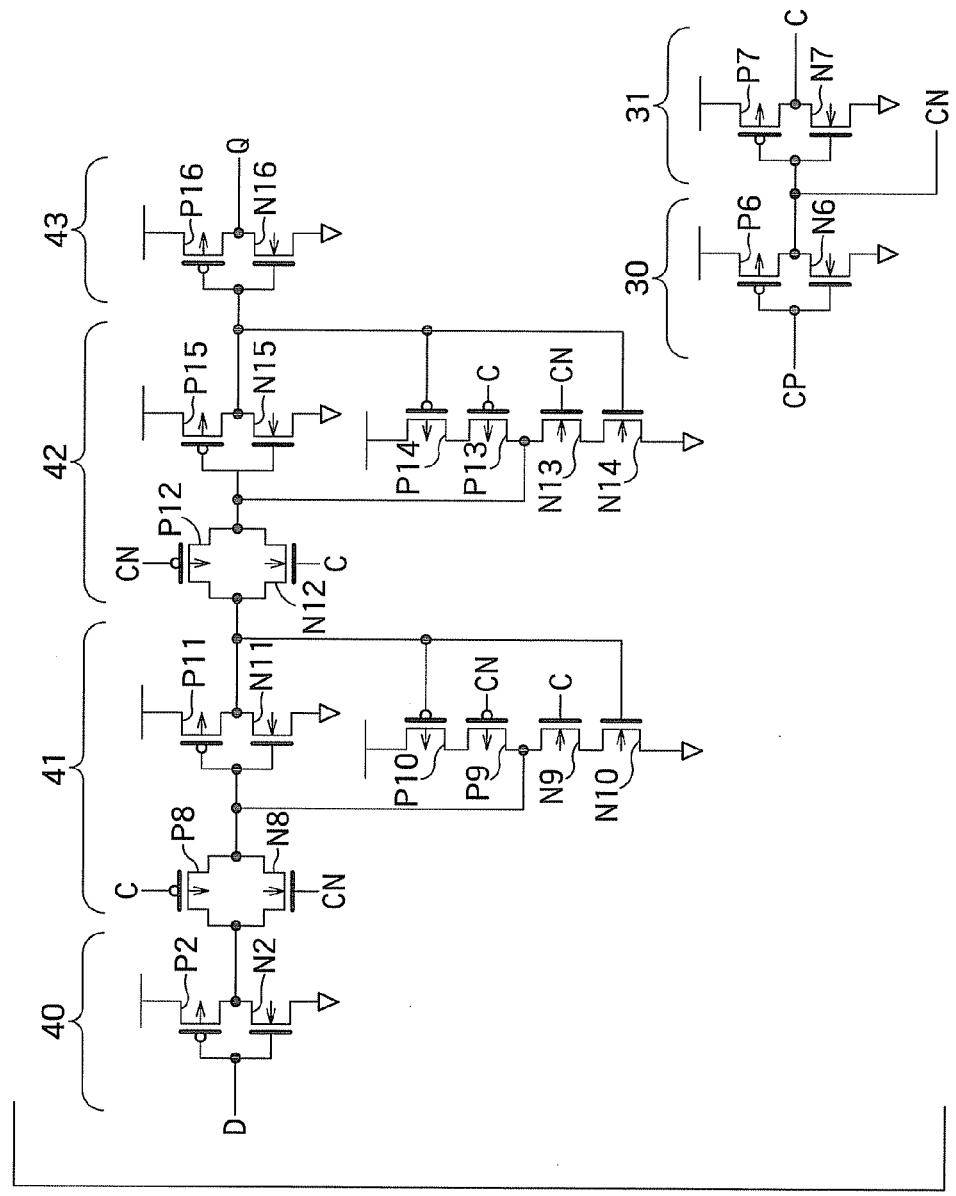
FIG. 5 is a circuit diagram of a flip-flop according to a fourth embodiment of the present invention.

FIG. 5 is a circuit diagram of the flip-flop according to the fourth embodiment. In the flip-flop, the input circuit unit 40 in the circuit diagram of FIG. 10 is transformed into an inverter (input inverter) composed of transistors P2/N2. The other components of the circuit are the same as those in FIG. 10, so that identical reference numerals are given to identical components, and description on the identical components will not be repeated here.

Figure 6:
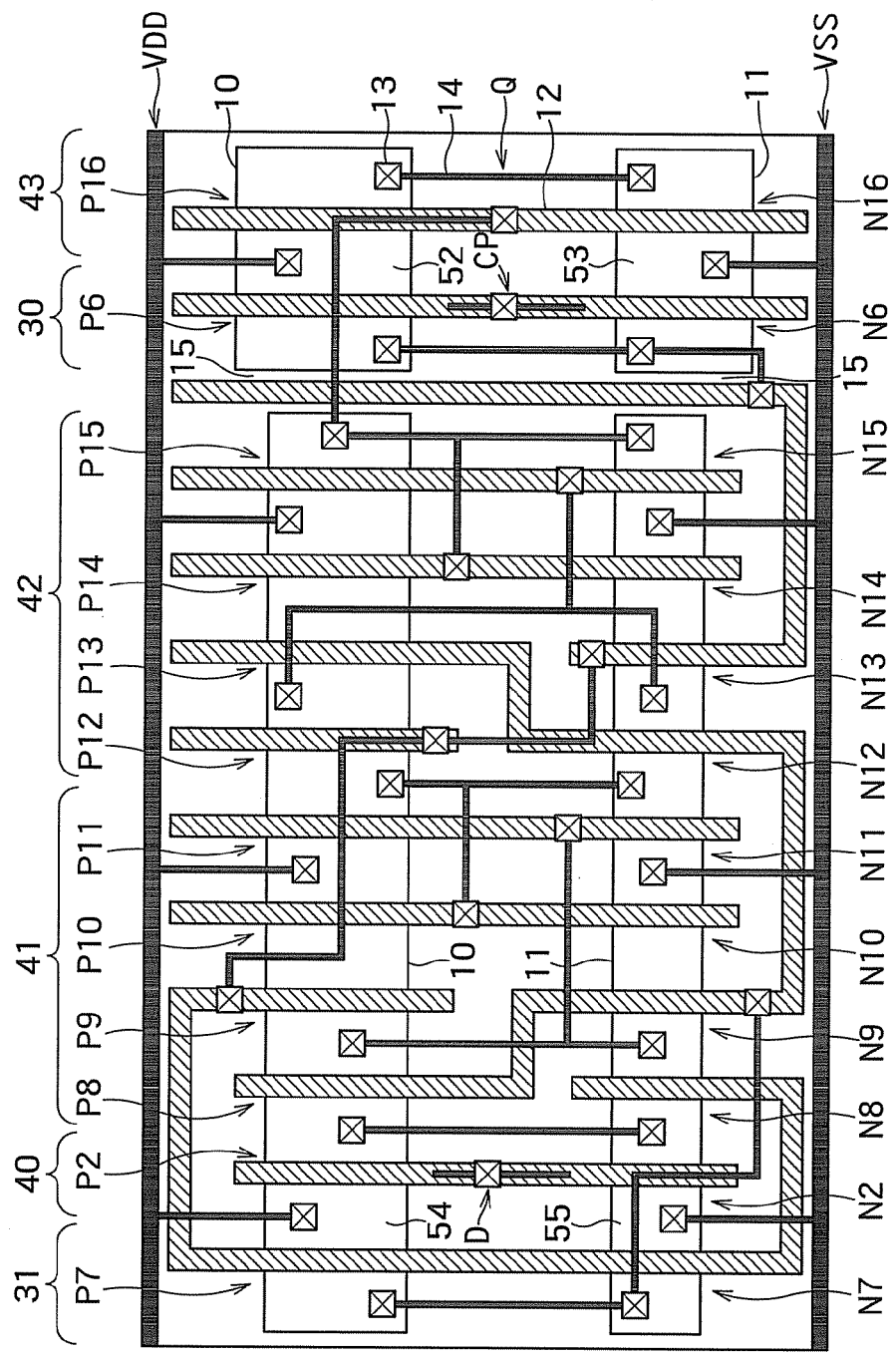
FIG. 6 is a plan view showing a layout of a flip-flop according to the fourth embodiment of the present invention.

FIG. 6 is a plan view showing a layout of the flip-flop according to the fourth embodiment.

Figure 7:
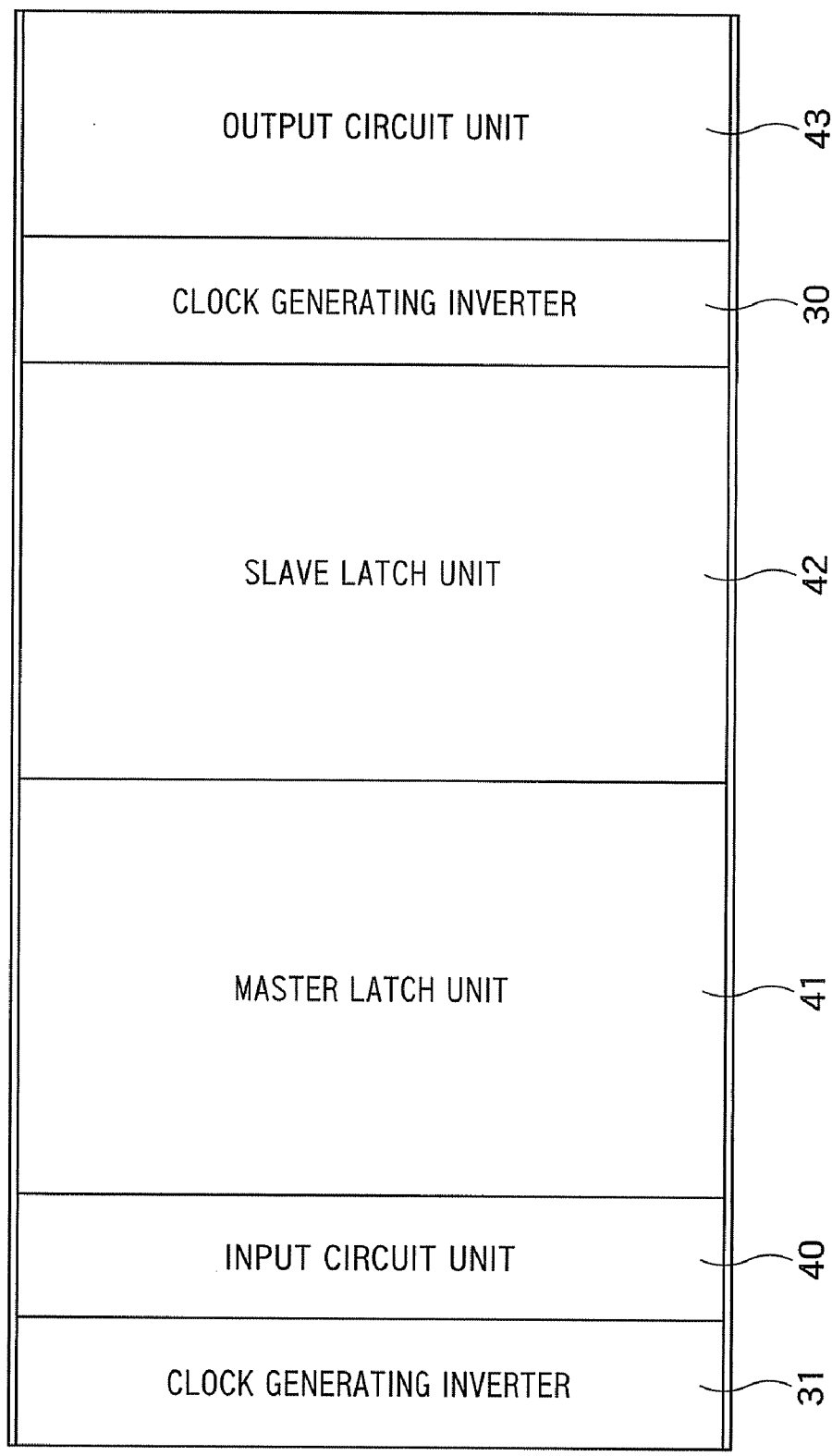
FIG. 7 is a schematic diagram showing an arrangement of each component in a layout of the flip-flop according to the fourth embodiment of the present invention.

FIG. 7 is a schematic diagram showing an arrangement of each component in the layout of the flip-flop. As shown in FIG. 7, a clock generating inverter 31, an input circuit unit 40, a master latch unit 41, a slave latch unit 42, a clock generating inverter 30, and an output circuit unit 43 are arranged in this order.

As shown in FIGS. 6 and 7, in the present embodiment, the two inverters, namely, clock generating inverters 30 and 31 (transistors P6/N6 and transistors P7/N7, respectively) are arranged in two positions separate from each other so as to sandwich the input circuit unit 40, the master latch unit 41, and the slave latch unit 42.

Further, the transistors P7/N7 of the clock generating inverter 31 placed on the left side of the input circuit unit 40 and transistors P2/N2 of the input circuit unit 40 share their respective source regions 54 and 55. The source region 54 (fifth source region) shared by the PMOS transistors is connected to a power supply interconnection VDD. The source region 55 (sixth source region) shared by the NMOS transistors is connected to a power supply interconnection VSS.

Further, similarly to the first embodiment, the transistors P6/N6 of the clock generating inverter 30 placed on the right side of the slave latch unit 42 and transistors P16/N16 of an output inverter in the output circuit unit 43 share their respective source regions 52 and 53.

In the clock generating inverter 31, the input circuit unit 40, the master latch unit 41, and the slave latch unit 42, diffusion regions 10 of the PMOS transistors P2 and P7 to P15 are formed integrally and, similarly, diffusion regions 11 of the NMOS transistors N2 and N7 to N15 are also formed integrally. Further, similarly to the first embodiment, in the clock generating inverter 30 and the output circuit unit 43, the diffusion regions 10 of the PMOS transistors P6 and P16 are formed integrally and, similarly, the diffusion regions 11 of the NMOS transistors N6 and N16 are also formed integrally.

By using such a constitution, in the present embodiment, the number of STI regions 15 as element isolation regions can be decreased to one, namely, the region between the transistors P15/N15 and the transistors P6/N6. This reduces the horizontal cell size to a length of 14 grids.

It is to be noted that in a case where the two clock generating inverters 30 and 31 are arranged in one position and they share the same source region, there exist the two STI regions 15 as element isolation regions, so that the horizontal cell size may be 15-grid long.

As described above, according to the present embodiment, the two inverters of clock generating inverters 30 and 31 are arranged so as to sandwich the input circuit unit 40, the master latch unit 41, and the slave latch unit 42, so that the clock generating inverter 30 and the input circuit unit 43 may share the same source region and the clock generating inverter 31 and the input circuit unit 40 may share the same source region. With this structure, similarly to the first embodiment, it is possible to reduce the number of the STI regions 15 as element isolation regions in the cell, thereby decreasing the cell size.

Although the embodiments of the present invention have been described above in detail, a specific configuration is not limited to the above embodiments and can be implemented by being variously modified within a scope which does not depart from a gist of the present invention.

For example, the order of the arrangement in the above-described first through third embodiments may be reversed to arrange the output circuit unit 43, the clock generating inverter 30, the slave latch unit 42, the master latch unit 41, the clock generating inverter 31, and the input circuit unit 40 in this order, or the input circuit unit 40, the clock generating inverter 31, the master latch unit 41, the slave latch unit 42, the clock generating inverter 30, and the output circuit unit 43 may be arranged vertically in this order.

Also, although the first through fourth embodiments have been described with reference to a standard cell-type flip-flop, any other flip-flops than the standard cell-type one may be used.

Further, although the first through fourth embodiments have been described with reference to one example of including two inverters, namely, the clock generating inverters 30 and 31, more than two clock generating inverters may be included.

The invention claimed is:

1. A semiconductor device comprising:
a flip-flop circuit formed in a CMOS semiconductor integrated circuit,
wherein the flip-flop circuit comprises at least a first clock generating inverter that generates a first clock signal, and a second clock generating inverter that generates a second clock signal obtained by inverting the first clock signal,
the first clock generating inverter and the second clock generating inverter are arranged so as to sandwich a latch unit in a layout pattern of the flip-flop circuit, the latch unit comprising a master latch unit and a slave latch unit in the flip-flop circuit,
the first clock generating inverter and a first other circuit in the flip-flop circuit are configured to share a source region, the first other circuit being adjacent to the first clock generating inverter in the layout pattern, and
the second clock generating inverter and a second other circuit in the flip-flop circuit are configured to share a source region, the second other circuit being adjacent to the second clock generating inverter in the layout pattern.

2. The semiconductor device according to claim 1,
wherein the flip-flop circuit comprises:
an input circuit unit, as the second other circuit, configured to supply a signal to the latch unit based on an input signal; and
an output circuit unit, as the first other circuit, configured to output an output signal based on a signal from the latch unit, and
wherein the input circuit unit, the second clock generating inverter, the master latch unit, the slave latch unit, the first clock generating inverter, and the output circuit unit are arranged in this order in the layout pattern.

3. The semiconductor device according to claim 2,
wherein the master latch unit and the slave latch unit in the latch unit have a function of latching the signal supplied from the input circuit unit and outputting the latched signal to the output circuit unit, based on the first clock signal and the second clock signal,
the master latch unit comprising:
a first transmission gate, an input terminal of the first transmission gate being connected to an output terminal of the input circuit unit, and the first transmission gate being supplied with the first clock signal and the second clock signal;
a first inverter, an input terminal of the first inverter being connected to an output terminal of the first transmission gate; and
a first clocked inverter, an input terminal of the first clocked inverter being connected to an output terminal of the first inverter, an output terminal of the first clocked inverter being connected to both the input terminal of the first inverter and the output terminal of the first transmission gate, and the first clocked inverter being supplied with the first clock signal and the second clock signal, and
the slave latch unit comprising:
a second transmission gate, an input terminal of the second transmission gate being connected to both the output terminal of the first inverter and the input terminal of the first clocked inverter in the master latch unit, and the second transmission gate being supplied with the first clock signal and the second clock signal;
a second inverter, an input terminal of the second inverter being connected to an output terminal of the second transmission gate, and an output terminal of the second inverter being connected to an input terminal of the output circuit unit; and
a second clocked inverter, an input terminal of the second clocked inverter being connected to the output terminal of the second inverter, an output terminal of the second clocked inverter being connected to both the input terminal of the second inverter and the output terminal of the second transmission gate, and the second clocked inverter being supplied with the first clock signal and the second clock signal.

4. The semiconductor device according to claim 3,
wherein, in the master latch unit, the first transmission gate, the first clocked inverter, and the first inverter are arranged in this order from the side of the second clock generating inverter in the layout pattern, and
in the slave latch unit, the second transmission gate, the second clocked inverter, and the second inverter are arranged in this order from the side of the master latch unit in the layout pattern.

5. The semiconductor device according to claim 2,
wherein the master latch unit and the slave latch unit in the latch unit have a function of latching the signal supplied from the input circuit unit and outputting the latched signal to the output circuit unit, based on the first clock signal and the second clock signal,
the master latch unit comprising:
a first transmission gate, an input terminal of the first transmission gate being connected to an output terminal of the input circuit unit, and the first transmission gate being supplied with the first clock signal and the second clock signal;
a first inverter, an input terminal of the first inverter being connected to an output terminal of the first transmission gate;
a third inverter, an input terminal of the third inverter being connected to an output terminal of the first inverter; and
a third transmission gate, an input terminal of the third transmission gate being connected to an output terminal of the third inverter, an output terminal of the third transmission gate being connected to both the input terminal of the first inverter and the output terminal of the first transmission gate, and the third transmission gate being supplied with the first clock signal and the second clock signal, and
the slave latch unit comprising:
a second transmission gate, an input terminal of the second transmission gate being connected to both the output terminal of the first inverter and the input terminal of the third inverter in the master latch unit, and the second transmission gate being supplied with the first clock signal and the second clock signal;

a second inverter, an input terminal of the second inverter being connected to an output terminal of the second transmission gate, and an output terminal of the second inverter being connected to an input terminal of the output circuit unit;

a fourth inverter, an input terminal of the fourth inverter being connected to both the output terminal of the second inverter and an input terminal of the output circuit unit; and a fourth transmission gate, an input terminal of the fourth transmission gate being connected to an output terminal of the fourth inverter, an output terminal of the fourth transmission gate being connected to both the input terminal of the second inverter and the output terminal of the second transmission gate, and the fourth transmission gate being supplied with the first clock signal and the second clock signal.

6. The semiconductor device according to claim 5, wherein, in the master latch unit, the first transmission gate, the third transmission gate, the third inverter, and the first inverter are arranged in this order from the side of the second clock generating inverter in the layout pattern, and in the slave latch unit, the second transmission gate, the fourth transmission gate, the fourth inverter, and the second inverter are arranged in this order from the side of the master latch unit in the layout pattern.

7. The semiconductor device according to claim 2, wherein the input circuit unit has a function of supplying any one of a first input signal and a second input signal, input as the input signal, to the master latch unit in the latch unit, based on a control signal, and the input circuit unit comprises:
  a third clocked inverter that supplies the first input signal to the master latch unit when the control signal is at a first value; and
  a fourth clocked inverter that supplies the second input signal to the master latch unit when the control signal is at a second value.

8. The semiconductor device according to claim 7, wherein in the input circuit unit, the third clocked inverter and the fourth clocked inverter are arranged in this order from the end side of the flip-flop circuit in the layout pattern.

9. The semiconductor device according to claim 8, wherein the source region, shared by the second clock generating inverter and the input circuit unit, comprises a first source region and a second source region, a PMOS transistor of the fourth clocked inverter and a PMOS transistor of the second clock generating inverter share the first source region, the first source region being connected to a higher-voltage side power supply interconnection, and an NMOS transistor of the fourth clocked inverter and an NMOS transistor of the second clock generating inverter share the second source region, the second source region being connected to a lower-voltage side power supply interconnection.

10. The semiconductor device according to claim 2, wherein the input circuit unit has a function of supplying any one of a first input signal and a second input signal, input as the input signal, to the master latch unit in the latch unit, based on a control signal, and the input circuit unit comprises:
  a fifth inverter and a fifth transmission gate that supply the first input signal to the master latch unit when the control signal is at a first value; and
  a sixth inverter and a sixth transmission gate that supply the second input signal to the master latch unit when the control signal is at a second value.

11. The semiconductor device according to claim 10, wherein in the input circuit unit, the fifth inverter, the fifth transmission gate, the sixth transmission gate, and the sixth inverter are arranged in this order from the end side of the flip-flop circuit in the layout pattern.

12. The semiconductor device according to claim 2, wherein the output circuit unit comprises an output inverter that inverts an output signal from the slave latch unit in the latch unit and outputs the inverted signal, the source region, shared by the first clock generating inverter and the output circuit unit, comprises a third source region and a fourth source region, a PMOS transistor of the output inverter and a PMOS transistor of the first clock generating inverter share the third source region, the third source region being connected to a higher-voltage side power supply interconnection, and an NMOS transistor of the output inverter and an NMOS transistor of the first clock generating inverter share the fourth source region, the fourth source region being connected to a lower-voltage side power supply interconnection.

13. The semiconductor device according to claim 2, wherein a shallow trench isolation (STI) region is formed between the second clock generating inverter and the master latch unit, and between the slave latch unit and the first clock generating inverter, respectively, and a dummy gate is arranged in each of the STI regions.

14. The semiconductor device according to claim 1, wherein an output of the first clock generating inverter and an input of the second clock generating inverter are connected to each other with at least one of a metal interconnection and a gate interconnection.

15. The semiconductor device according to claim 1, wherein the flip-flop circuit comprises:
  an input circuit unit, as the second other circuit, configured to supply a signal to the latch unit based on an input signal; and
  an output circuit unit, as the first other circuit, configured to output an output signal based on the signal from the latch unit, and wherein the second clock generating inverter, the input circuit unit, the master latch unit, the slave latch unit, the first clock generating inverter, and the output circuit unit are arranged in this order in the layout pattern.

16. The semiconductor device according to claim 15, wherein the input circuit unit comprises an input inverter that inverts the input signal and supplies the inverted signal to the master latch unit in the latch unit, the source region, shared by the second clock generating inverter and the input circuit unit, comprises a fifth source region and a sixth source region, a PMOS transistor of the input inverter and a PMOS transistor of the second clock generating inverter share the fifth source region, the fifth source region being connected to a higher-voltage side power supply interconnection, and an NMOS transistor of the input inverter and an NMOS transistor of the second clock generating inverter share the sixth source region, the sixth source region being connected to a lower-voltage side power supply interconnection.

17. The semiconductor device according to claim 15,
wherein the output circuit unit comprises an output inverter that inverts the output signal from the slave latch unit in the latch unit and outputs the inverted signal,
the source region, shared by the first clock generating inverter and the output circuit unit, comprises a third source region and a fourth source region,
a PMOS transistor of the output inverter and a PMOS transistor of the first clock generating inverter share the third source region, the third source region being connected to a higher-voltage side power supply interconnection, and
an NMOS transistor of the output inverter and an NMOS transistor of the first clock generating inverter share the fourth source region, the fourth source region being connected to a lower-voltage side power supply interconnection.

18. The semiconductor device according to claim 15,
wherein an STI region is formed between the slave latch unit and the first clock generating inverter, and
a dummy gate is disposed in the STI region.

19. The semiconductor device according to claim 1,
wherein diffusion regions of PMOS transistors in the first clock generating inverter and in the first other circuit are formed integrally, and diffusion regions of NMOS transistors in the first clock generating inverter and in the first other circuit are formed integrally,
diffusion regions of PMOS transistors in the second clock generating inverter and in the second other circuit are formed integrally, and diffusion regions of NMOS transistors in the second clock generating inverter and the second other circuit are formed integrally, and
diffusion regions of PMOS transistors in the latch unit are formed integrally, and diffusion regions of NMOS transistors in the latch unit are formed integrally.

20. The semiconductor device according to claim 1,
wherein diffusion regions of PMOS transistors in the first clock generating inverter and in the first other circuit are formed integrally, and diffusion regions of NMOS transistors in the first clock generating inverter and in the first other circuit are formed integrally, and
diffusion regions of PMOS transistors in the second clock generating inverter, in the second other circuit, and in the latch unit are formed integrally, and diffusion regions of NMOS transistors in the second clock generating inverter, in the second, other circuit, and in the latch unit are formed integrally.

* * * * *